(12) United States Patent
Eom et al.

(10) Patent No.: US 11,469,396 B2
(45) Date of Patent: Oct. 11, 2022

(54) DISPLAY APPARATUS

(71) Applicant: SAMSUNG DISPLAY CO., LTD., Yongin-si (KR)

(72) Inventors: Taejong Eom, Yongin-si (KR); Dohoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/158,419

(22) Filed: May 18, 2016

(65) Prior Publication Data
US 2017/0098797 A1 Apr. 6, 2017

(30) Foreign Application Priority Data
Oct. 6, 2015 (KR) .................. 10-2015-0140616

(51) Int. Cl.
*H01L 29/08* (2006.01)
*H01L 51/52* (2006.01)
*H01L 27/32* (2006.01)
*H01L 27/12* (2006.01)

(52) U.S. Cl.
CPC ...... *H01L 51/5246* (2013.01); *H01L 27/3262* (2013.01); *H01L 27/3276* (2013.01); *H01L 27/124* (2013.01); *H01L 27/1248* (2013.01); *H01L 27/3258* (2013.01); *H01L 51/525* (2013.01)

(58) Field of Classification Search
CPC .............. H01L 27/124; H01L 27/3262; H01L 27/3276; H01L 51/5246; H01L 51/525
See application file for complete search history.

(56) References Cited

U.S. PATENT DOCUMENTS

| | | | | | |
|---|---|---|---|---|---|
| 5,335,103 | A | * | 8/1994 | Kim ...................... | G02F 1/1339 349/154 |
| 5,396,356 | A | * | 3/1995 | Fukuchi ................ | G02F 1/1339 349/106 |
| 5,684,555 | A | * | 11/1997 | Shiba .................... | G02F 1/1345 349/149 |
| 5,739,880 | A | * | 4/1998 | Suzuki ............. | G02F 1/133512 349/110 |
| 5,995,189 | A | * | 11/1999 | Zhang ................... | G02F 1/1339 345/206 |

(Continued)

FOREIGN PATENT DOCUMENTS

KR 10-2006-0059745 A 6/2006
KR 10-2008-0020760 A 3/2008
(Continued)

*Primary Examiner* — Jay C Kim
(74) *Attorney, Agent, or Firm* — Lewis Ruca Rothgerber Christie LLP (57) ABSTRACT

A display apparatus includes: a display substrate; a display on the display substrate, the display comprising a display device; a sealing substrate on the display substrate; a sealing member bonding the display substrate and the sealing substrate, the sealing member surrounding the display; a first metal line below the sealing member and surrounding the display; a second metal line on the display substrate and spaced apart from the first metal line; and one or more connectors connecting the first metal line and the second metal line with each other.

15 Claims, 8 Drawing Sheets

(56) References Cited

U.S. PATENT DOCUMENTS

| | | | | |
|---|---|---|---|---|
| 6,072,556 | A * | 6/2000 | Hirakata | G02F 1/1339 349/122 |
| 6,313,541 | B1 * | 11/2001 | Chan | H01L 24/05 257/690 |
| 6,359,606 | B1 * | 3/2002 | Yudasaka | H01L 27/3246 313/483 |
| 6,573,968 | B2 * | 6/2003 | Jeong | G02F 1/1339 349/153 |
| 6,587,160 | B2 * | 7/2003 | Lee | G02F 1/136204 349/187 |
| 6,665,037 | B2 * | 12/2003 | Hagiwara | G02F 1/1345 349/139 |
| 6,720,944 | B1 * | 4/2004 | Ishii | G02F 1/1345 345/87 |
| 6,731,369 | B2 * | 5/2004 | Choo | G02F 1/1345 349/139 |
| 6,734,942 | B2 * | 5/2004 | Takeuchi | G02F 1/1339 349/153 |
| 6,737,289 | B2 * | 5/2004 | Woo | G02F 1/1339 349/153 |
| 6,839,122 | B2 * | 1/2005 | Chung | G02F 1/1339 349/153 |
| 6,858,944 | B2 * | 2/2005 | Huang | H01L 24/05 257/773 |
| 6,859,247 | B2 * | 2/2005 | Murade | G02F 1/136286 349/139 |
| 6,888,606 | B2 * | 5/2005 | Hinata | G02F 1/1339 349/149 |
| 6,919,949 | B2 * | 7/2005 | Hong | G02F 1/1339 349/153 |
| 6,922,226 | B2 * | 7/2005 | Park | G02F 1/13452 349/149 |
| 6,958,801 | B2 * | 10/2005 | Lee | G02F 1/1339 349/153 |
| 6,982,779 | B2 * | 1/2006 | Park | G02F 1/1339 349/153 |
| 7,019,718 | B2 * | 3/2006 | Yamazaki | G02F 1/1339 345/76 |
| 7,145,290 | B2 * | 12/2006 | Kang | H01L 51/5246 313/512 |
| 7,180,566 | B2 * | 2/2007 | Lee | G02F 1/1339 349/154 |
| 7,187,423 | B2 * | 3/2007 | Ozaki | G02F 1/136259 345/104 |
| 7,199,855 | B2 * | 4/2007 | Yoshimi | G02F 1/1303 349/187 |
| 7,212,263 | B2 * | 5/2007 | Jeoung | G02F 1/133512 349/106 |
| 7,294,034 | B2 * | 11/2007 | Yamada | H01J 9/261 445/24 |
| 7,432,994 | B2 * | 10/2008 | Chu | G02F 1/136209 349/111 |
| 7,436,473 | B2 * | 10/2008 | Nam | G02F 1/133512 349/110 |
| 7,486,368 | B2 * | 2/2009 | Sakakura | H01L 51/5237 349/153 |
| 7,515,241 | B2 * | 4/2009 | Kim | G02F 1/1339 349/153 |
| 7,538,488 | B2 * | 5/2009 | Kwak | H01L 51/5246 313/506 |
| 7,598,672 | B2 * | 10/2009 | Nakajima | H01L 51/524 313/512 |
| 7,667,798 | B2 * | 2/2010 | Nakagawa | G02F 1/1339 349/106 |
| 7,675,175 | B2 * | 3/2010 | Tokitoh | H01L 23/585 257/620 |
| 7,782,437 | B2 * | 8/2010 | Yamada | G02F 1/1339 349/110 |
| 7,837,530 | B2 * | 11/2010 | Park | H01L 51/5246 445/24 |
| 7,898,632 | B2 * | 3/2011 | Yokokawa | G02F 1/1337 349/152 |
| 7,920,225 | B2 * | 4/2011 | Nishikawa | G06F 1/1626 349/11 |
| 7,986,393 | B2 * | 7/2011 | Morita | G02F 1/1339 349/151 |
| 8,039,852 | B2 * | 10/2011 | Inoue | G02F 1/1341 257/202 |
| 8,044,398 | B2 * | 10/2011 | Ning | G02F 1/136286 257/350 |
| 8,049,412 | B2 * | 11/2011 | Kwak | H01L 27/3276 313/504 |
| 8,063,561 | B2 * | 11/2011 | Choi | H01L 51/5246 313/500 |
| 8,164,257 | B2 * | 4/2012 | Choi | H01L 27/3276 313/504 |
| 8,243,225 | B2 * | 8/2012 | Kai | G06F 3/0414 349/12 |
| 8,248,568 | B2 * | 8/2012 | Anjo | G02F 1/134363 349/152 |
| 8,298,033 | B2 * | 10/2012 | Kim | H01L 51/5246 445/25 |
| 8,299,705 | B2 * | 10/2012 | Choi | H01L 51/5246 313/512 |
| 8,334,963 | B2 * | 12/2012 | Yoshida | G02F 1/1339 349/153 |
| 8,339,564 | B2 * | 12/2012 | Maruyama | G02F 1/1341 349/153 |
| 8,395,909 | B2 * | 3/2013 | Cho | G02F 1/133308 313/46 |
| 8,421,983 | B2 * | 4/2013 | Jung | G02F 1/1339 349/153 |
| 8,507,157 | B2 * | 8/2013 | Lee | B32B 37/185 430/5 |
| 8,525,401 | B2 * | 9/2013 | Lee | H01L 51/5246 313/495 |
| 8,552,643 | B2 * | 10/2013 | Yoshinaga | H01L 51/5253 313/504 |
| 8,564,197 | B2 * | 10/2013 | Kwon | H01L 27/3276 445/25 |
| 8,564,198 | B2 * | 10/2013 | Kim | H01L 51/5246 313/512 |
| 8,614,776 | B2 * | 12/2013 | Lee | B23K 26/009 349/110 |
| 8,665,191 | B2 * | 3/2014 | Kwak | G09G 3/3208 257/355 |
| 8,749,135 | B2 * | 6/2014 | Liu | H01L 51/525 313/512 |
| 8,836,901 | B2 * | 9/2014 | Lee | G02F 1/1345 349/138 |
| 8,890,830 | B2 * | 11/2014 | Choi | G06F 3/041 345/156 |
| 8,913,221 | B2 * | 12/2014 | Moriwaki | G02F 1/1345 349/138 |
| 8,926,389 | B2 * | 1/2015 | Nishido | H01L 51/0097 445/25 |
| 8,988,627 | B2 * | 3/2015 | Tae | H01L 22/32 349/54 |
| 9,048,350 | B2 * | 6/2015 | Nishido | H01L 33/0095 |
| 9,063,381 | B2 * | 6/2015 | Fujiwara | G02F 1/1339 |
| 9,105,594 | B2 * | 8/2015 | Yamazaki | G02F 1/13454 |
| 9,196,804 | B2 * | 11/2015 | Cho | H01L 51/5243 |
| 9,252,388 | B2 * | 2/2016 | Jang | H01L 51/5256 |
| 9,257,668 | B2 * | 2/2016 | Choi | H01L 51/5246 |
| 9,258,853 | B2 * | 2/2016 | Nishido | H05B 33/04 |
| 9,281,494 | B2 * | 3/2016 | Lee | H01L 27/3276 |
| 9,304,359 | B2 * | 4/2016 | Nagami | G02F 1/1339 |
| 9,312,509 | B2 * | 4/2016 | Kwak | H01L 27/3276 |
| 9,323,294 | B2 * | 4/2016 | Esaka | G06F 3/044 |
| 9,323,372 | B2 * | 4/2016 | Kim | G06F 3/0412 |
| 9,331,304 | B2 * | 5/2016 | Cho | H01L 51/5246 |
| 9,372,367 | B2 * | 6/2016 | Wang | G02F 1/13306 |
| 9,379,353 | B2 * | 6/2016 | Hsiao | H01L 51/5246 |
| 9,448,441 | B2 * | 9/2016 | Moriwaki | G02F 1/1337 |
| 9,453,997 | B2 * | 9/2016 | Hendriks | G02B 26/005 |
| 9,502,683 | B2 * | 11/2016 | Hong | H01L 51/524 |
| 9,570,702 | B2 * | 2/2017 | Hong | H01L 51/5246 |
| 9,570,703 | B2 * | 2/2017 | Gong | H01L 51/5246 |
| 9,627,656 | B2 * | 4/2017 | Lee | H01L 51/56 |

(56) References Cited

U.S. PATENT DOCUMENTS

| | | | |
|---|---|---|---|
| 9,633,871 B2* | 4/2017 | Hatano | H01L 21/50 |
| 9,660,003 B2* | 5/2017 | Sato | H01L 27/323 |
| 9,664,952 B2* | 5/2017 | Nagaoka | G02F 1/1339 |
| 9,666,755 B2* | 5/2017 | Shimomura | H01L 33/0095 |
| 9,685,488 B2* | 6/2017 | Hong | H01L 27/323 |
| 9,735,390 B2* | 8/2017 | Kim | H01L 51/5246 |
| 9,741,783 B2* | 8/2017 | Cho | H01L 27/3276 |
| 9,818,975 B2* | 11/2017 | Hong | H01L 27/3258 |
| 9,825,253 B2* | 11/2017 | Cho | H01L 51/5246 |
| 9,853,062 B2* | 12/2017 | Tezuka | H01L 27/124 |
| 9,853,242 B2* | 12/2017 | Nishido | B32B 9/005 |
| 9,870,744 B2* | 1/2018 | Fujikawa | G02F 1/136286 |
| 9,891,475 B2* | 2/2018 | Lee | G02F 1/133512 |
| 9,905,796 B2* | 2/2018 | Hong | H01L 51/5243 |
| 10,048,542 B2* | 8/2018 | Ai | H01L 27/124 |
| 10,734,601 B2* | 8/2020 | Choi | H01L 51/5246 |
| 2005/0190335 A1* | 9/2005 | Maruyama | G02F 1/1339 |
| | | | 349/153 |
| 2006/0066772 A1* | 3/2006 | Takahashi | G02F 1/133308 |
| | | | 349/60 |
| 2007/0096631 A1* | 5/2007 | Sung | G02F 1/1339 |
| | | | 313/498 |
| 2007/0291216 A1* | 12/2007 | Chan | G02F 1/1339 |
| | | | 349/153 |
| 2010/0079065 A1* | 4/2010 | Kamiura | H01L 27/3244 |
| | | | 313/504 |
| 2011/0273423 A1* | 11/2011 | Hsu | G02F 1/1341 |
| | | | 345/211 |
| 2012/0002145 A1* | 1/2012 | Lee | G02F 1/136204 |
| | | | 349/106 |
| 2012/0074838 A1* | 3/2012 | Im | H01J 5/20 |
| | | | 313/504 |
| 2013/0003006 A1* | 1/2013 | Wang | G02F 1/1339 |
| | | | 349/138 |
| 2013/0033834 A1* | 2/2013 | Kwon | H01L 51/5246 |
| | | | 361/760 |
| 2015/0102293 A1* | 4/2015 | Cho | H01L 33/56 |
| | | | 257/40 |

FOREIGN PATENT DOCUMENTS

| | | |
|---|---|---|
| KR | 10-2008-0051788 A | 6/2008 |
| KR | 100897157 B1 | 5/2009 |
| KR | 10-2012-0067207 A | 6/2012 |
| KR | 10-2015-0042622 A | 4/2015 |
| KR | 10-2015-0043148 A | 4/2015 |

* cited by examiner

DISPLAY APPARATUS

CROSS-REFERENCE TO RELATED APPLICATION

This application claims priority to and the benefit of Korean Patent Application No. 10-2015-0140616, filed on Oct. 6, 2015, in the Korean Intellectual Property Office, the disclosure of which is incorporated herein in its entirety by reference.

BACKGROUND

1. Field

Aspects of one or more example embodiments of the present invention relate to a display apparatus.

2. Description of the Related Art

Generally, display apparatuses such as an organic light-emitting display (OLED) apparatus or a liquid-crystal display (LCD) apparatus including a thin film transistor (TFT) are popular to utilize as display apparatuses for various types of mobile devices such as digital cameras, video cameras, camcorders, portable information terminals, or smartphones.

Such display apparatuses may utilize sealing to protect internal components of the display device from external contaminants. For example, a plurality of substrates utilized in a display apparatus may be bonded together, through a method of applying sealing material between the substrates and hardening the sealing material using any suitable method, such as by irradiating a laser beam thereto from a laser.

A metal line may be arranged below the sealing material in order to increase adhesion of an upper substrate to a lower substrate. As the width of the metal line arranged below the sealing material expands, the sealing material may be unevenly formed, however, which in turn may increase a risk of cutting defects of a substrate.

It is to be understood that this Background section is intended to provide useful background for understanding the technology and as such, the Background section of the present disclosure may include ideas, concepts, or recognitions that do not constitute prior art.

SUMMARY

Additional aspects will be set forth in part in the description which follows and, in part, will be apparent from the description, or may be learned by practice of the following example embodiments.

According to one or more example embodiments of the present invention, a display apparatus includes: a display substrate; a display on the display substrate, the display comprising a display device; a sealing substrate on the display substrate; a sealing member bonding the display substrate and the sealing substrate, the sealing member surrounding the display; a first metal line below the sealing member and surrounding the display; a second metal line on the display substrate and spaced apart from the first metal line; and one or more connectors connecting the first metal line and the second metal line with each other.

According to some embodiments, the second metal line includes a first portion extending in a lengthwise direction of the display and a second portion extending in a widthwise direction of the display.

According to some embodiments, the display apparatus further includes two or more connectors connecting the first metal line to the second metal line, wherein the two or more connectors are provided at both ends of each of the first portion and the second portion of the second metal line.

According to some embodiments, the two or more connectors are spaced apart from one another by a first distance along the lengthwise direction of the display between the first portion of the second metal line and the first metal line, and spaced apart from one another by a second distance along the widthwise direction of the display between the second portion of the second metal line and the first metal line.

According to some embodiments, first distance is equal to the second distance.

According to some embodiments, first distance is different from the second distance.

According to some embodiments, the display includes a thin film transistor comprising a gate electrode, a source electrode, and a drain electrode, and a capacitor including a plurality of capacitor electrodes; and the first metal line and the second metal line are on a same layer as any one of the gate electrode, the source electrode, the drain electrode, and the plurality of capacitor electrodes.

According to some embodiments, the first metal line and the second metal line include a same material as a material in any one of the gate electrode, the source electrode, the drain electrode, and the plurality of capacitor electrodes.

According to some embodiments, the display apparatus further includes a plurality of insulating layers between the display substrate and the sealing member, wherein the first metal line and the second metal line are between the plurality of insulating layers and the sealing member.

According to some embodiments, the first metal line and the second metal line are at different layers.

According to some embodiments, the first metal line and the second metal line are at a same layer.

According to some embodiments, the first metal line is spaced from the second metal line by 30 μm or more.

According to some embodiments, the sealing member includes glass frit.

According to some embodiments, the display device is an organic light-emitting device including a first electrode, an intermediate layer comprising an organic light-emitting layer, and a second electrode consecutively stacked on one another, respectively.

BRIEF DESCRIPTION OF THE DRAWINGS

These and/or other aspects and features of example embodiments of the present invention will become more apparent and more readily appreciated from the following description of the example embodiments, taken in conjunction with the accompanying drawings in which.

DETAILED DESCRIPTION

As the invention allows for various changes and numerous embodiments, example embodiments will be illustrated in the drawings and described in more detail in the written description. Aspects and features of the present invention and ways to achieve those will become more clearly understood, when referring to example embodiments described later in more detail with drawings. This invention may, however, be embodied in many different forms and should not be construed as limited to the example embodiments set forth herein.

Hereinafter, aspects of example embodiments of the present invention will be described in more detail by explaining example embodiments of the present invention with reference to the attached drawings. In explaining example embodiments of the present invention by referring to the drawings, the same reference numerals will be given to virtually the same or corresponding components, and some redundant explanation may be omitted.

It will be understood that although the terms "first," "second," etc. may be used herein to describe various components, these components should not be limited by these terms. These components are only used to distinguish one component from another. Thus, a first element, component, region, layer or section described below could be termed a second element, component, region, layer or section, without departing from the spirit and scope of the present invention.

As used herein, the singular forms "a," "an" and "the" are intended to include the plural forms as well, unless the context clearly indicates otherwise.

It will be understood that the terms "comprises" and/or "comprising" used herein specify the presence of stated features or components, but do not preclude the presence or addition of one or more other features or components.

It will be further understood that when a layer, region, or component is referred to as being "formed on" another layer, region, or component, it can be directly or indirectly formed on the other layer, region, or component. That is, for example, intervening layers, regions, or components may be present, unless stated otherwise.

In the drawings, sizes of components may be magnified or minimized for the convenience of explanation. For example, as size and thickness of each component shown in the drawings may be presented arbitrarily for the convenience of explanation, the present invention is not limited thereto.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
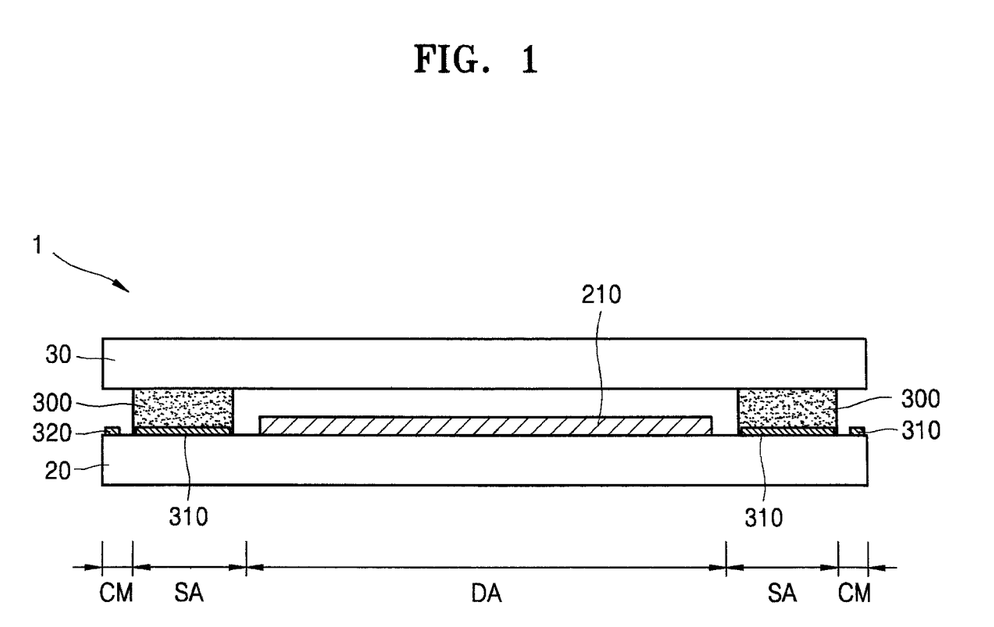
FIG. 1 is a schematic plan view of a display apparatus, according to some example embodiments of the present invention.
Figure 2:
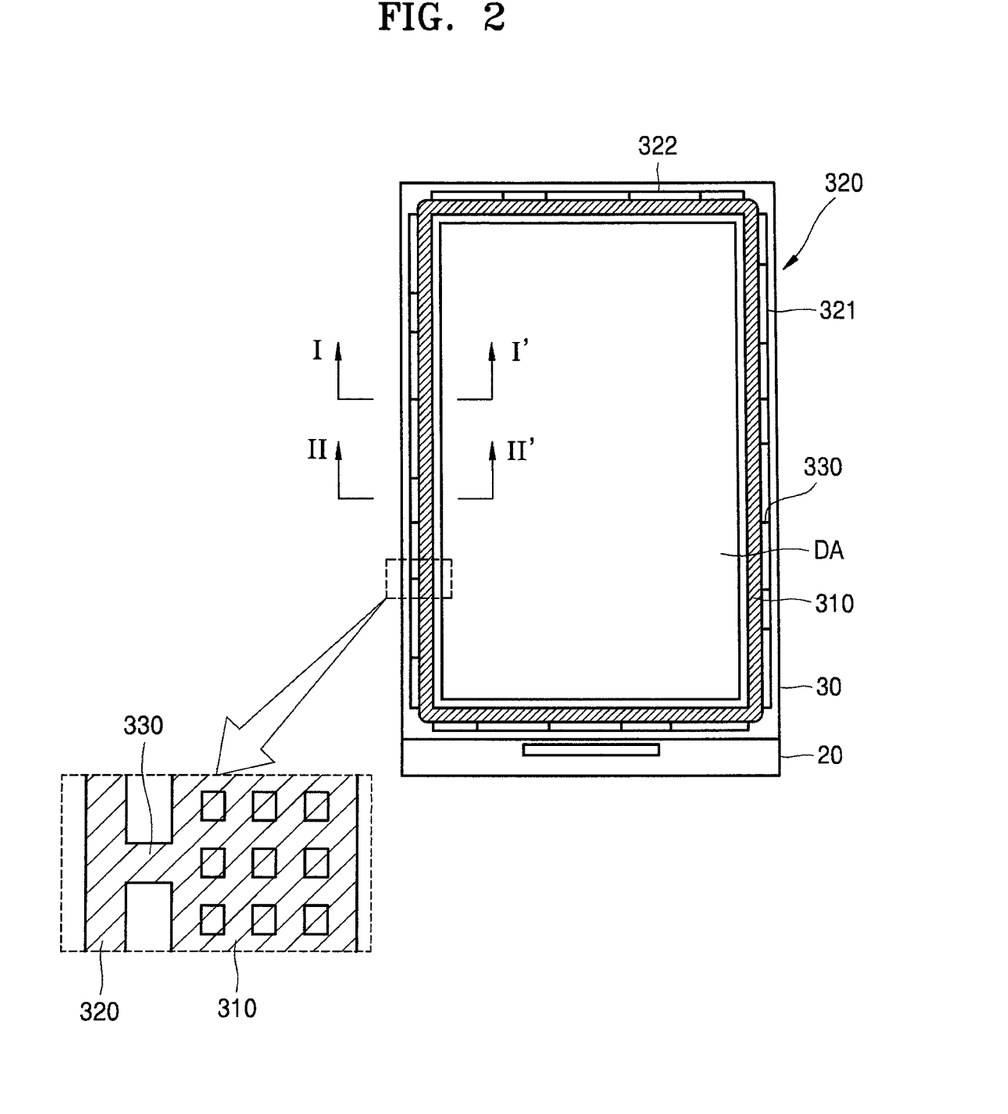
FIG. 2 is a schematic plan view of the display apparatus, according to some example embodiments of the present invention.

FIG. 1 is a schematic plan view of a display apparatus 1, according to an example embodiment. FIG. 2 is a schematic plan view of the display apparatus 1, according to an example embodiment.

Referring to FIGS. 1 and 2, the display apparatus 1, according to an example embodiment, may include a display substrate 20 provided with a display (or display area) DA, a sealing substrate 30 arranged to face (or overlap with) the display substrate 20, and a sealing portion (or sealing area) SA bonding the display substrate 20 and the sealing substrate 30 together. In some embodiments, below the sealing portion SA, the display apparatus 1 may include a first metal line 310 which surrounds the display DA (e.g., circumferentially or around a periphery of the display DA) and a second metal line 320, which is arranged to be spaced apart from the first metal line 310.

The display substrate 20 may include a transparent glass material with $SiO_2$ as a main component. However, the material of the display substrate 20 is not limited thereto, and the display substrate 20 may include various materials such as transparent plastic material or metal.

The display DA may be arranged on the display substrate 20. On the display DA, an array of pixels may be formed, and the pixels may be controlled by thin film transistors, respectively. The display DA may include a display device 210. In some embodiments, the display device 210 may include a display device, which may produce an image by using an organic light-emitting diode (OLED) device, a liquid crystal display device, or an electrophoretic display device. In some embodiments, pixels of the display DA may include a thin film transistor and a liquid crystal layer which may be controlled by the thin film transistors respectively, and a backlight overlapping the display DA may be arranged.

The sealing substrate 30 may block external contaminants, moisture, or air from affecting the display device 210, which is included in the display DA. On the sealing substrate 30, a polarizing film or/and a color filter may be further provided, depending on circumstances.

The sealing portion SA is a portion by which the display substrate 20 and the sealing substrate 30 bind together. The sealing portion SA may include a sealing member 300 and the first metal line 310. A cutting area CM may be a portion to be cut and divide an entire panel of display apparatuses into individual display apparatuses. The cutting area CM may include the second metal line 320, which may be arranged to be spaced apart from the first metal line 310 by a distance (e.g., a predetermined distance), and a connector 330, which may connect the first metal line 310 and the second metal line 320 with each other.

The sealing portion SA may prevent or reduce instances of oxygen or moisture penetrating into the display DA and may improve mechanical strength of the display apparatus by bonding the display substrate 20 and the sealing substrate 30 together. In an example embodiment, the sealing portion SA may be arranged to continuously surrounding the display DA (e.g., circumferentially or around a periphery of the display DA). For example, the sealing portion SA may be arranged continuously along or around an edge of the display substrate 20 and the sealing substrate 30.

The first metal line 310 may be a metal layer arranged or formed below the sealing member 300. As the first metal line 310 may transfer heat to the sealing member 300 by absorbing or/and reflecting a laser beam, the first metal line 310 may increase effective seal width or/and help harden the sealing member 300 evenly with just a low intensity of energy source. In this case, the effective seal width may refer to a width with which the sealing member 300 may connect the display substrate 20 to the sealing substrate 30 and block the flow of air and moisture after the sealing member 300 is melted and sintered again by absorbing heat energy.

The second metal line 320 may be a metal layer arranged to be spaced apart from the first metal line 310 by a distance (e.g., a predetermined distance). The second metal line 320 may be arranged at an outer edge of the sealing portion SA. In this case, the outer edge of the sealing portion SA may refer to an area which is far away (or furthest away) from the display DA.

From a different perspective, the first metal line 310 may be formed continuously along the edge of the display DA while being arranged below the sealing portion SA. In this case, the second metal line 320 may be arranged to be spaced apart from the first metal line 310, and may be formed to surround the first metal line 310 around the edges of the display DA.

In an example embodiment, the second metal line 320 may include a 2-1 metal line 321 extending in a lengthwise direction of the display apparatus 1 and a 2-2 metal line 322 line extending in a widthwise direction of the display apparatus 1. In this case, the 2-1 metal line 321 and the 2-2 metal line 322 may be arranged alternately in a circumferential direction of the display apparatus 1. Accordingly, the second metal line 320 may be arranged to surround the first metal line 310 around the edges of the display DA.

The connector 330 is a connecting member, which may interconnect the first metal line 310 and the second metal line 320 with each other. The connector 330 may be a metal layer, and may electrically connect the first metal line 310 and the second metal line 320 with each other while being arranged between the first metal line 310 and the second metal line 320.

Figure 3A:
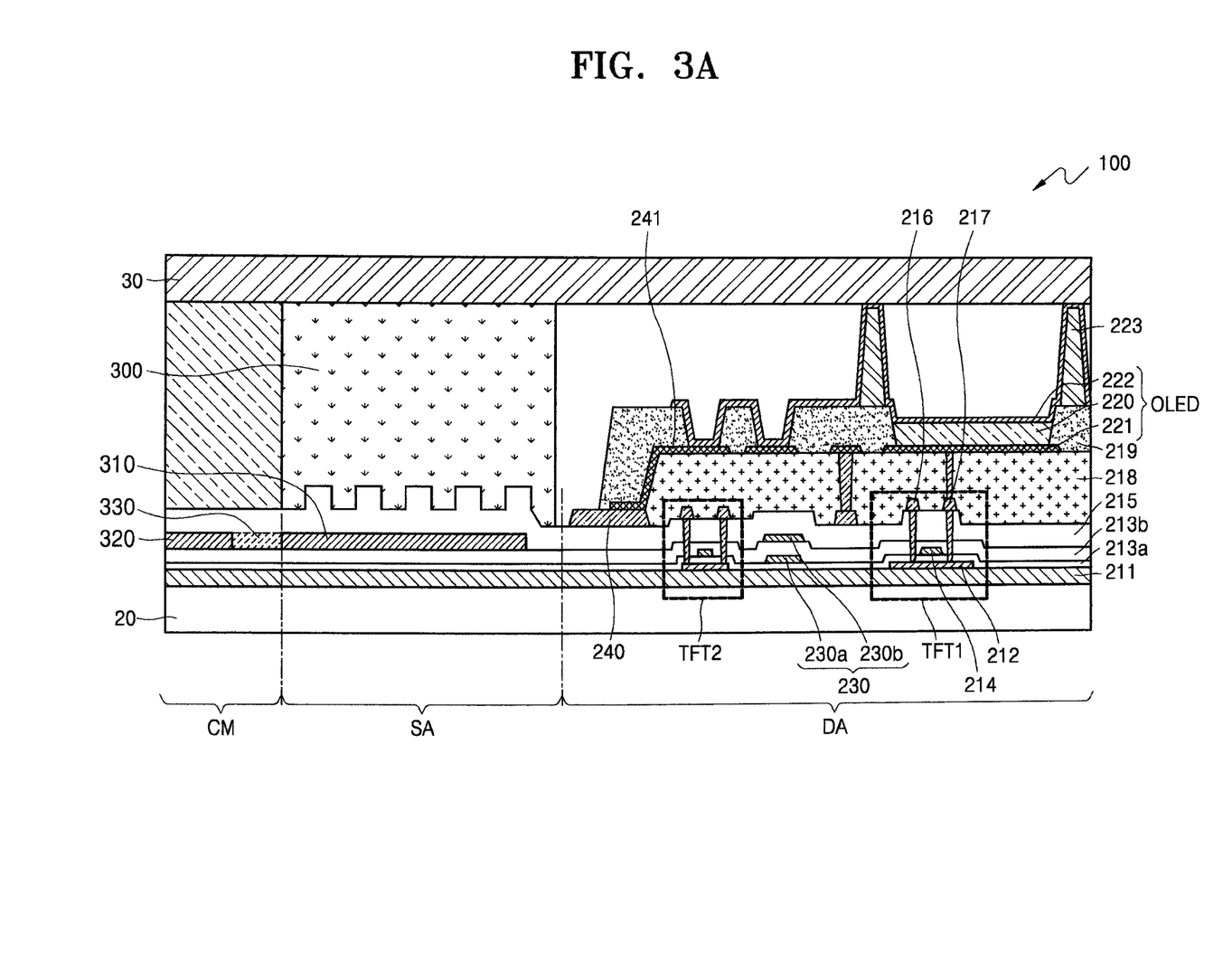
FIG. 3A is a partial cross-sectional view of the display apparatus, cut along the line I-I' shown in FIG. 2.
Figure 3B:
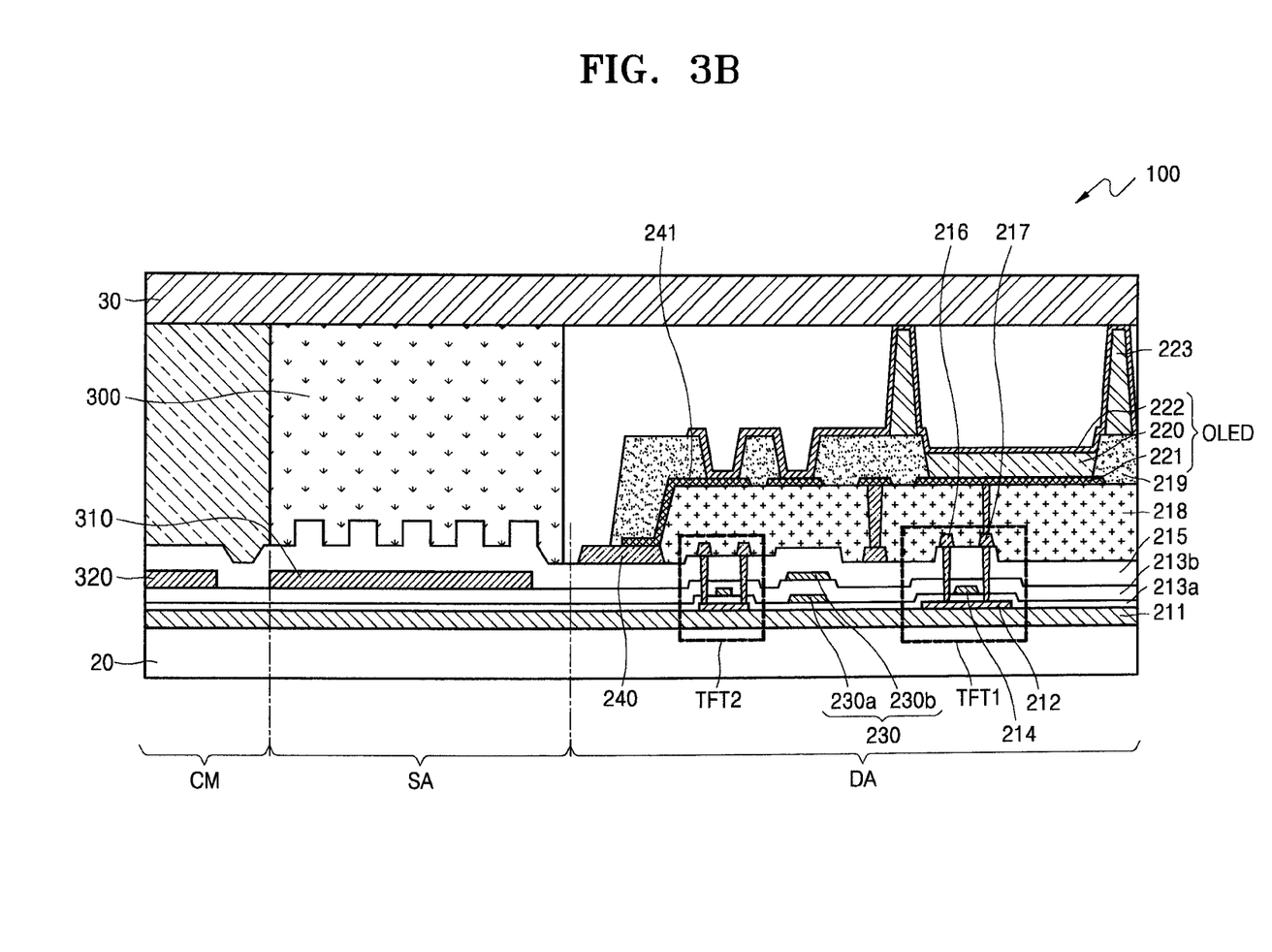
FIG. 3B is a partial cross-sectional view of the display apparatus, cut along the line II-II' shown in FIG. 2

FIG. 3A is a partial cross-sectional view of the display apparatus 1, cut along the line I-I' shown in FIG. 2, and FIG. 3B is a partial cross-sectional view of the display apparatus 1, cut along the line II-II' shown in FIG. 2. In the present embodiment, the display apparatus 1 will be described by using an OLED as an example, but is not limited thereto and may include any particular display apparatus, which produces an image by application of electricity thereto (e.g., a liquid crystal display device (LCD), a field emission display device (FED), or an electronic paper display device (EPD)).

Referring to FIGS. 3A and 3B, the display apparatus 1 may include the display DA displaying an image, the sealing portion SA sealing the display DA, and the cutting area CM to be cut and divide the entire panel of display apparatuses into individual display apparatuses.

The display substrate 20 may further include a buffer layer 211. The buffer layer 211 may prevent an impurity ion from proliferating on a top surface of the display substrate 20 and keep moisture or external air from infiltrating the display substrate 20, and planarize a surface of the display substrate 20. According to some example embodiments, the buffer layer 211 may be omitted. The buffer layer 211 may be formed by using various methods such as a plasma-enhanced chemical vapor deposition (PECVD), an atmospheric pressure CVD (APCVD), or a low pressure CVD (LPCVD).

The display DA may be provided with the display device 210 which produces an image, as shown in FIG. 1. As previously described in some detail, the display device 210 may be an OLED, an LCD, or an electrophoretic display device. However, according to some embodiments, the display device 210 may be an OLED display device, as an example.

A first thin film transistor TFT1 and a second thin film transistor TFT2 may each include an activation layer 212, a gate electrode 214, a source electrode 216 and a drain electrode 217. A first gate insulation film 213a for insulating the gate electrode 214 and the activation layer 212 from each other may be between the gate electrode 214 and the activation layer 212. The gate electrode 214 may overlap a part of the activation layer 212 on the first gate insulation film 213a. The first thin film transistor TFT1 may be arranged or formed below the OLED, and may be a driving thin film transistor for driving the OLED.

The activation layer 212 may be arranged on the buffer layer 211. The activation layer 212 may include an inorganic semiconductor such as amorphous silicon or polysilicon or an organic semiconductor.

A first gate insulation film 213a may be provided on the buffer layer 211, covering the activation layer 212. A second gate insulation film 213b may be formed on the first gate insulation film 213a and covers the gate electrode 214.

The gate electrode 214 may include a single layer or layers including Au, Ag, Cu, Ni, Pt, Pd, Al, Mo, Cr, an alloy of Al and Nd or an alloy of Mo and W.

The first gate insulation film 213a and the second gate insulation film 213b may include an inorganic film such as silicon oxide, silicon nitride, and metal oxide, and such film may include a single layer or layers.

An interlayer insulation film 215 may be formed on the second gate insulation film 213b. The interlayer insulation film 215 may include an inorganic film such as silicon oxide and silicon nitride. The interlayer insulation film 215 may include an organic film.

The source electrode 216 and the drain electrode 217 may be formed on the interlayer insulation film 215. Each of the source electrode 216 and the drain electrode 217 may contact the activation layer 212 through a contact hole. The source electrode 216 and the drain electrode 217 may include a metal, an alloy, a metal nitride, a conductive metal oxide, or a transparent conductive material.

A structure of the thin film transistor is not limited thereto, and other thin film transistor structures may be possible. For example, the thin film transistor may be a top gate transistor, or a bottom gate transistor with the gate electrode 214 below the activation layer 212.

A capacitor 230 may be included in the display DA. The capacitor 230 may store a data signal supplied to the display device 210 or compensate for a voltage drop of the display device 210.

The capacitor 230 may include a first capacitor electrode 230A, a second capacitor electrode 230B, and the second gate insulation film 213b therebetween. The first and second capacitor electrode 230A and 230B may include the same material as the gate electrode 214.

A planarizing film 218 may be arranged on the interlayer insulation film 215 while covering the first and second thin film transistors TFT1 and TFT2 and the capacitor 230. The planarizing film 218 may eliminate a step of a layer therebelow and planarize the surface of the layer therebelow so as to increase a light-emitting efficiency of the OLED, which is arranged on the planarizing film 218. In some embodiments, the planarizing film 218 may have a penetration hole which exposes a portion of the drain electrode 217.

However, embodiments of the present invention are not limited to the structure previously described, and according to some example embodiments, either one of the planarizing film 218 and the interlayer insulation film 215 may be omitted, depending on circumstances.

The OLED may be arranged on the planarizing film 218, and may include a first electrode 221, an intermediate layer 220 including an organic light-emitting layer, and a second electrode 222. A pixel-defining film 219 may be arranged on the planarizing film 218 and cover a portion of the first electrode 221, and may define a pixel area and a non-pixel area.

A hole and an electron injected at the first electrode 221 and the second electrode 222 of the OLED may combine with the organic light-emitting layer of the intermediate layer 220 to produce light.

The intermediate layer 220 may include the organic light-emitting layer. In another example embodiment, the intermediate layer 220 may include the organic light-emitting layer and may further include at least one of a hole injection layer (HIL), a hole transport layer (HTL), an electron transport layer (ETL), and an electron injection layer (EIL). However, the present invention is not limited thereto, and the intermediate layer 220 may include the organic light-emitting layer and may further include other various functional layers.

The second electrode 222 may be formed on the intermediate layer 220. The second electrode 222 may form an electric field with the first electrode 221 to enable the intermediate layer 220 to emit light. The first electrode 221 may be patterned in each pixel, and the second electrode 222 may be formed so as to have a common voltage applied to all pixels. The second electrode 222 may be electrically connected through a power wiring 240 and a circuit wiring 241 which are provided at the edges of the display 22.

The first electrode 221 and the second electrode 222 may include a transparent electrode or a reflective electrode. The first electrode 221 may function as an anode electrode while the second electrode 222 may function as a cathode electrode, but not limited thereto. For example, the first electrode 221 may function as a cathode electrode while the second electrode 222 may function as an anode electrode.

Although the drawings of the present invention only show just one OLED, the display DA may include a plurality of the OLEDs. A pixel may be formed for each OLED, and each pixel may produce red, green, blue or white color.

A protective layer may be formed on the second electrode 222 and may cover and protect the OLED. The protective layer may use an inorganic insulation film and/or an organic insulation film.

A spacer 223 may be arranged between the display substrate 20 and the sealing substrate 30 and keep a distance between the display substrate 20 and the sealing substrate 30. The spacer 223 may be arranged to prevent a reduction in display capacity of the display apparatus 1 due to an external shock.

In some embodiments, the spacer 223 may be arranged on the pixel-defining film 219. The spacer 223 may be arranged while protruding toward the sealing substrate 30 from the pixel-defining film 219.

The second electrode 222 and/or the protective layer may be arranged on the spacer 223.

The sealing substrate 30 may be provided as a transparent component, as previously described. Accordingly, it is possible to have an image produced on the display device exposed externally through the sealing substrate 30.

In the sealing portion SA, the sealing member 300 may be arranged to surround the display device 210 between the display substrate 20 and the sealing substrate 30, and may seal a space between the display substrate 20 and the sealing substrate 30.

According to some example embodiments, the sealing member 300 may be an inorganic material. For example, the sealing member 300 may be a glass frit, and the glass frit may be applied over the sealing member 300 by using a dispenser or a screen printing method. Generally, glass frit refers to a glass ingredient in the form of powder, but the present invention is not limited thereto. According to some example embodiments of the present invention, glass frit may include a paste including not only such main material as SiO2 but also a laser or an infrared absorbing material, an organic binder, and a filler for reducing thermal expansion coefficient. The laser beam is irradiated to the sealing member 300, which in turn melts and hardens the sealing member 300 to bond the display substrate 20 and the sealing substrate 30 together.

In an example embodiment, with a laser-assisted vacuum packaging method, in order to bond the display substrate 20 and the sealing substrate 30 together by using the sealing member 300, it may be possible to apply the sealing member 300 (e.g., glass frit) having a thickness (e.g., a predetermined thickness) along the edges of the display substrate 20, and to remove a binder ingredient in the glass frit by heating and pre-calcinating the glass frit-applied sealing member. Then, by aligning the sealing substrate 30 above the display substrate 20, putting them into a vacuum sintering furnace, and heating just the glass frit-applied portion surgically (e.g., with precision) with the laser beam while heating them at an appropriate temperature below the melting point of the glass frit, it may possible to melt the glass frit and bond the display substrate 20 and the sealing substrate 30 together.

However, in using the laser-assisted vacuum packaging method, when the laser beam is irradiated onto the sealing member 300 and the sealing member 300 melts, a relatively large number of air bubbles may occur. In a phase of a pre-calcination, the area where sources of air bubbles such as moisture or binder ingredients are removed sufficiently may be 30 μm~40 μm away from the surface of the sealing member 300. As the sources of air bubbles remain without being removed sufficiently in the inside of the sealing member 300, a relatively large number of air bubbles may occur when the sealing member 300 melts.

That is, as the sealing member 300 is melted by the laser beam, a pin-hole which has been trapped inside the sealing member 300 may expand in a vacuum sintering furnace due to a difference in pressure, or a small amount of binder ingredients which have still remained without being removed in the phase of the pre-calcination burn, and thus air bubbles may be generated by gas. In the case that air bubbles, which occurred at the sealing member 300, are placed at a bonding surface of the display substrate and sealing substrate 20 and 30, and the sealing member 300, it may reduce an effective contact area of the display substrate and sealing substrate 20 and 30 and the sealing member 300, which may result in a decrease in adhesive strength of the sealing member 300. For example, air bubbles occurring inside the sealing member 300 may be placed mainly at an area between display substrate 20 and the sealing member 300, e.g., the space below the sealing member 300 where air bubbles have not been sufficiently removed. Accordingly, by removing air bubbles at the area between a top surface of the display substrate 20 and a bottom surface of the sealing member 300 or by expelling air bubbles upwardly to the top surface of the sealing member 300, it may be possible to prevent a reduction in the effective contact area between the display substrate 20 and the sealing member 300.

The first metal line 310 is a metal layer which is arranged below the sealing member 300, and may transfer heat to the space below the sealing member 300 by absorbing or/and reflecting laser light. Accordingly, by removing air bubbles or expelling air bubbles upwardly to the top surface of the sealing member 300, it may be possible to prevent a reduction in the effective contact area of the display substrate 20 and the sealing member 300.

The first metal line 310 may be formed to have the same width as that of the sealing member 300 and a uniform thickness so as to produce uniform heat energy all over the first metal line 310. The first metal line 310 may apply uniform heat amount all over the sealing member 300, by being present or positioned below the sealing member 300. However, the present invention is not limited thereto, and the width and a placement of the first metal line 310 may vary according to a shape and a number of the air bubbles placed at the space below the sealing member 300, so as to apply the heat amount exclusively to a part of the bottom of the sealing member 300. One or more first metal lines 310 may be provided depending on a location to which the heat is applied.

The first metal line 310 may include a conductive material or metal with resistance, an alloy or a combination of both so as to produce heat when an electric current goes through the first metal line 310. In an example embodiment, the first metal line 310 may be formed on the same layer as any one of the gate electrode 214, the source electrode 216, the drain electrode 217 or the first and second capacitor electrodes 230A and 230B. In this case, the first metal line 310 may include the same material as any one of the gate electrode 214, the source electrode 216, the drain electrode 217 or the first and second capacitor electrodes 230A and 230B (e.g., a single layer or a plurality of layers including, for example, Au, Ag, Cu, Ni, Pt, Pd, Al, Mo, Cr, an alloy of Al and Nd or an alloy of Mo and W).

The first metal line 310 may be arranged below the sealing member 300 in a lengthwise direction of the sealing member 300. In an example embodiment, the first metal line 310 may be arranged between the second gate insulation film 213b and the interlayer insulation film 215, and may be extended in a lengthwise direction of the sealing portion SA in which the sealing member 300 is placed. However, embodiments of the present invention are not limited thereto, and the first metal line 310 may be arranged at any location (e.g., any random location) between the sealing member 300 and the display substrate 20 (e.g., between the second gate insulation film 213b and the sealing member 300).

The second metal line 320 may be arranged to be spaced apart from the first metal line 310 by a distance (e.g., a predetermined distance) so as to be electrically connected to the first metal line 310. Accordingly, by reducing resistance which occurs from the first metal line 310, it may be possible to prevent or reduce instances of a delamination, which may be caused by an electrostatic discharge (ESD) of the sealing member 300 and the display substrate 20.

The second metal line 320 may be arranged to be spaced apart from the first metal line 310 so as to be formed surrounding the first metal line 310. In an example embodiment, as shown in FIG. 2, the second metal line 320 may include the 2-1 metal line 321 (i.e., a first portion of the second metal line 320) extending in a lengthwise direction of the display DA and the 2-2 metal line 322 (i.e., a second portion of the second metal line 320) extending in a widthwise direction of the display DA. In this case, the 2-1 metal line 321 and the 2-2 metal line 322 may be arranged alternately along a circumferential direction (or around the periphery) of display DA. Accordingly, the second metal line 320 may be arranged so as to surround the first metal line 310. The 2-1 metal line 321 and the 2-2 metal line 322 may be arranged to be spaced apart as shown in FIG. 2, but the present invention is not limited thereto. The second metal line 320 may be formed continuously so as to surround the first metal line 310.

The second metal line 320 may be formed to include a width (e.g., a predetermined width) (e.g., a width of more than 50 μm) so as to reduce resistance that may be caused from the first metal line 310.

In some embodiments, the second metal line 320 may include a conductive material or metal with resistance, an alloy or a combination of both. In an example embodiment, the second metal line 320 may be formed on the same layer as any one of the gate electrode 214, the source electrode 216, the drain electrode 217 or the first and second capacitor electrodes 230A and 230B. In this case, the second metal line 320 may include the same material as any one of the gate electrode 214, the source electrode 216, the drain electrode 217 or the first and second capacitor electrodes 230A and 230B (e.g., a single-layer film or multi-layer film including Au, Ag, Cu, Ni, Pt, Pd, Al, Mo, Cr, an alloy of Al and Nd or an alloy of Mo and W). In this case, the second metal line 320 may include either a same material as that of the first metal line 310 or of a different material from that of the first metal line 310.

The second metal line 320 may be arranged on the same layer as the first metal line 310. For example, in the case that the first metal line 310 is arranged between the second gate insulation film 213b and the interlayer insulation film 215, the second metal line 320 may be arranged to be spaced apart from the first metal line 310 by a distance (e.g., a predetermined distance) between the second gate insulation film 213b and the interlayer insulation film 215. However, embodiments of the present invention are not limited thereto, and the second metal line 320 may be arranged on a different layer from the first metal line 310. For example, if the first metal line 310 is arranged between the second gate insulation film 213b and the interlayer insulation film 215, the second metal line 320 may be arranged between the first gate insulation film 213a and the second gate insulation film 213b.

The connector 330 is the connecting member that may be arranged between the first metal line 310 and the second metal line 320 to electrically connect the first metal line 310 and the second metal line 320 with each other. The connector 330 may include the same material as that of the first metal line 310 or the second metal line 320 (e.g., the single-layer film or the multi-layer film including Au, Ag, Cu, Ni, Pt, Pd, Al, Mo, Cr, an alloy of Al and Nd or an alloy of Mo and W). A relative placement relationship among the first metal line 310 and the second metal line 320, and the connector 330 will be described in more detail hereinafter, by referring to the figures.

Figure 4:
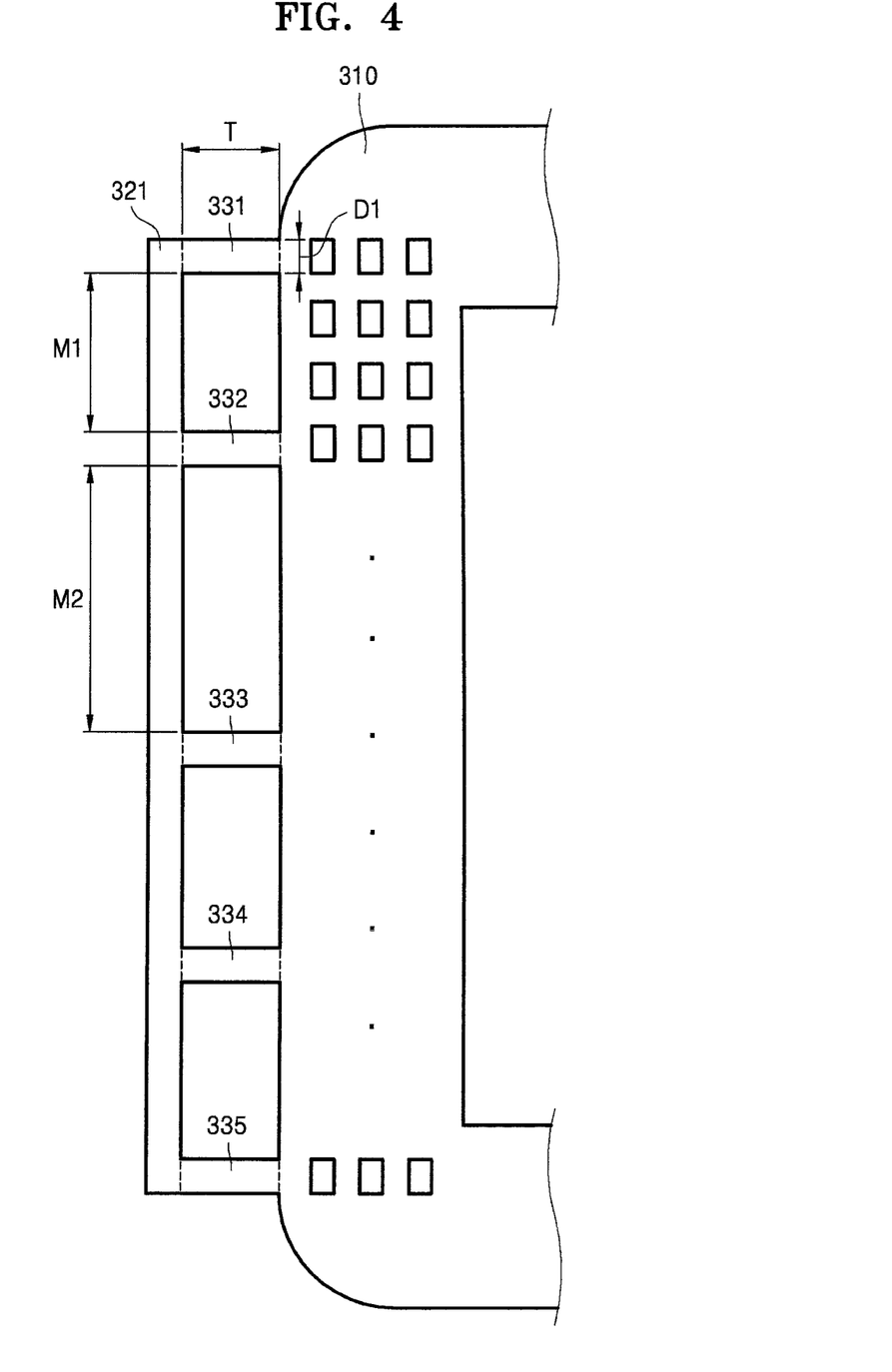
FIG. 4 is a partial cross-sectional view of the display apparatus, cut along a lengthwise direction, according to some example embodiments of the present invention.
Figure 5:
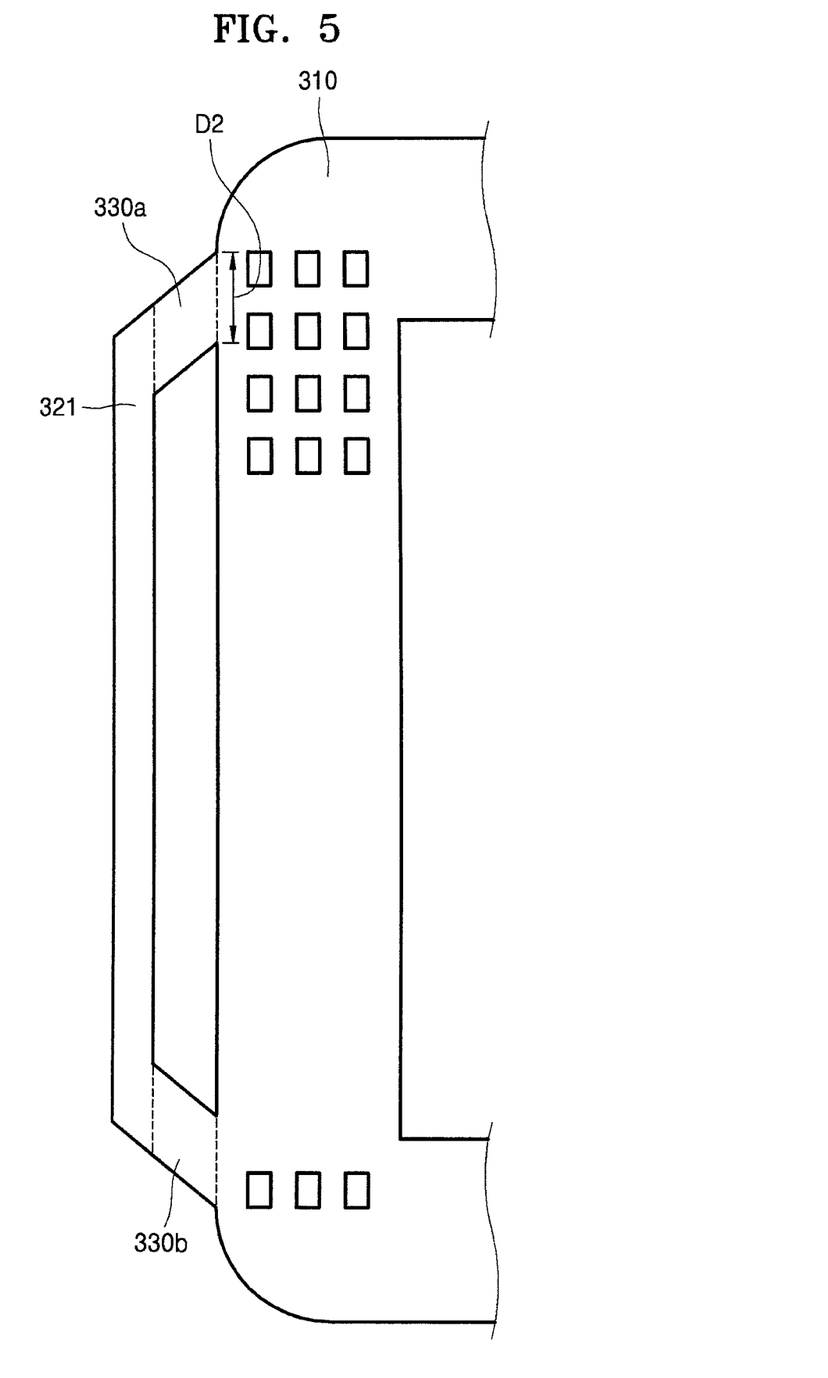
FIG. 5 is a partial cross-sectional view of the display apparatus, cut along a lengthwise direction, according to some example embodiments of the present invention.

FIG. 4 is a partial cross-sectional view of the display apparatus 1, cut along a lengthwise direction thereof, according to an example embodiment. FIG. 5 is a partial cross-sectional view of the display apparatus 1, cut along a lengthwise direction thereof, according to another example embodiment. As shown in FIG. 1, the connector 330 may connect the first metal line 310, the 2-1 metal line 321 and the 2-2 metal line 322, respectively. In this case, because a connective relationship of the first metal line 310, the 2-1 metal line 321 and the 2-2 metal line 322 by the connector 330 is identical or substantially identical, hereinafter the connector 330 will be described by focusing on the connector 330 which connects the first metal line 310 and the 2-1 metal line 321 for the convenience of explanation.

Referring to FIGS. 1 and 4, the first metal line 310 and the 2-1 metal line 321 may be arranged to be spaced apart by a distance (e.g., a predetermined distance) (e.g., a first distance T) and the connector 330 may be arranged between the first metal line 310 and the 2-1 metal line 321 so as to connect the first metal line 310 and the 2-1 metal line 321. In an example embodiment, the first distance T may be 30 µm or more.

In an example embodiment, as shown in FIG. 4, the connector 330 may include a plurality of the connecting members 331 through 335, and the connecting members 331 through 335 may be arranged to be spaced apart from one another by a distance (e.g., a predetermined distance) (e.g., a second distance M) along a lengthwise direction of the display DA. For example, a first connecting member 331 and a second connecting member 332 may be arranged to be spaced apart by a 2-1 distance M1, and a second connecting member 332 and a third connecting member 333 may be arranged to be spaced apart by a 2-2 distance M2. In this case, the 2-1 distance M1 and the 2-2 distance M2 may be formed identically (or substantially identically) or differently.

In another example embodiment, as shown in FIG. 5, the connector 330 may include the third and fourth connecting members 330A and 330B, and may be arranged at both ends of the 2-1 metal line 321 so as to be spaced apart. In this case, a width D2 of the third and fourth connecting members 330A and 330B may be formed to be larger than a width D1 of the first connecting member 331 as shown in FIG. 4, but example embodiments of the present invention are not limited thereto.

Figure 6A:
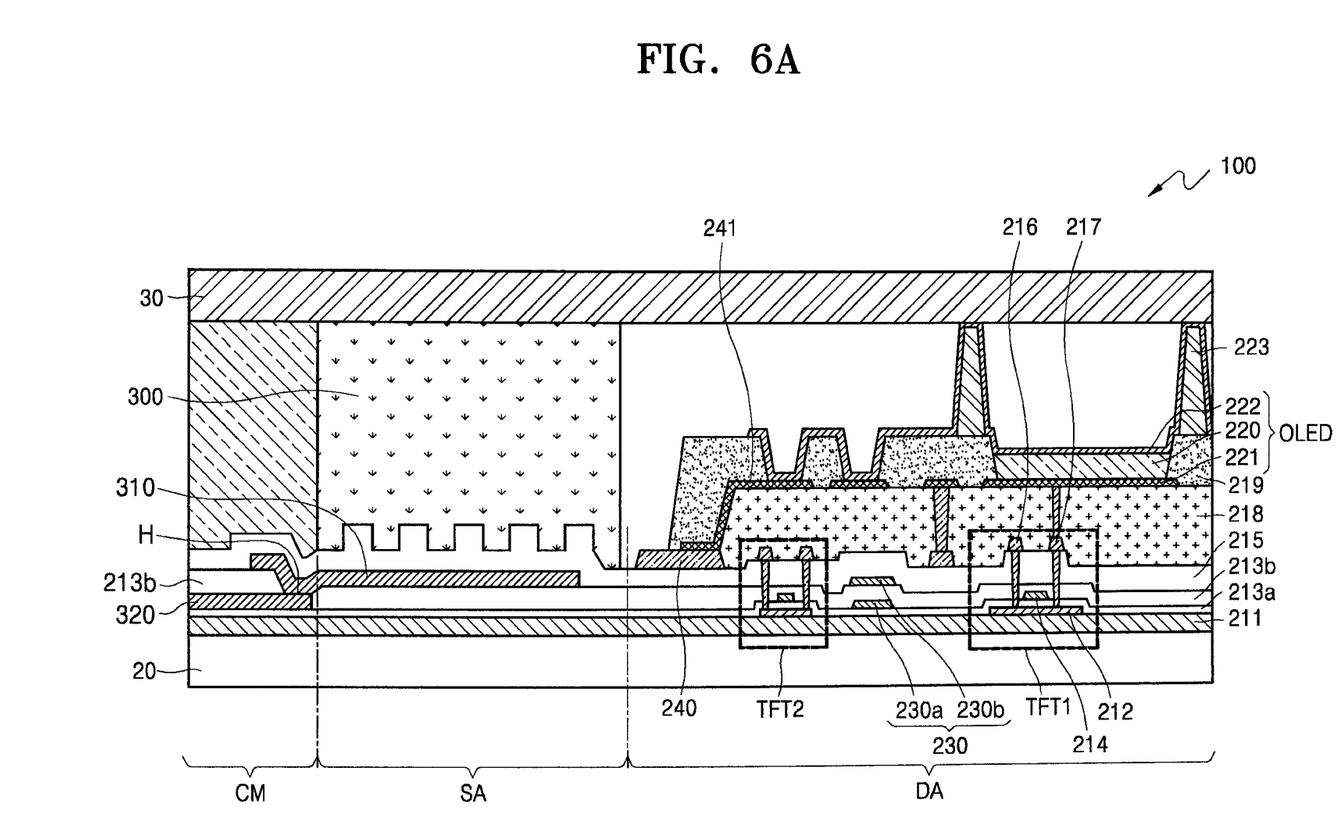
FIG. 6A is a partial cross-sectional view of the display apparatus, cut along the line I-I' shown in FIG. 2, according to some example embodiments of the present invention.
Figure 6B:
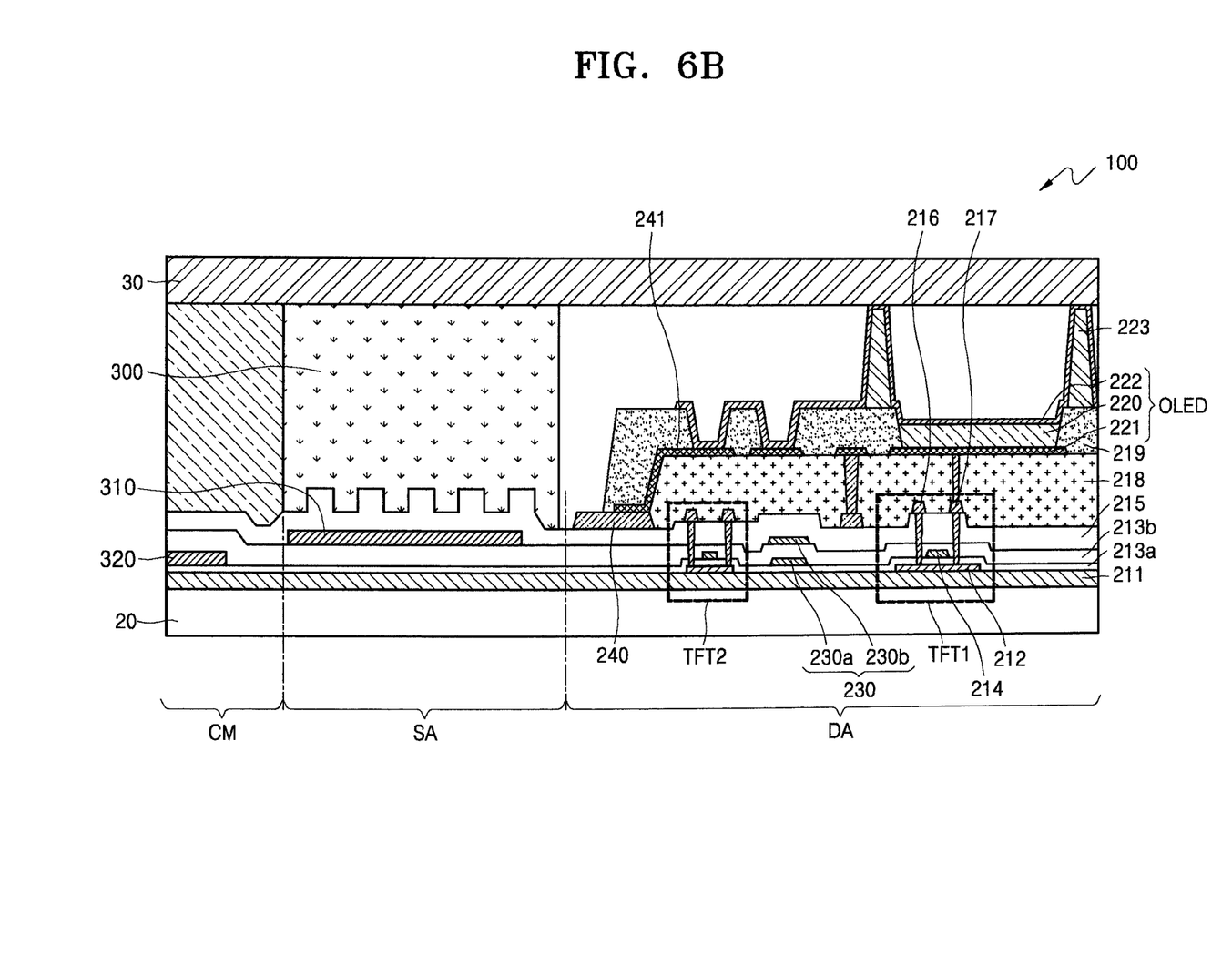
FIG. 6B is a partial cross-sectional view of the display apparatus, cut along the line II-II' shown in FIG. 2, according to some example embodiments of the present invention.

FIG. 6A is a partial cross-sectional view of the display apparatus 1, cut along the line I-I' shown in FIG. 2, according to another example embodiment. FIG. 6B is a partial cross-sectional view of the display apparatus 1, cut along the line II' shown in FIG. 2, according to another example embodiment. For the convenience of explanation, descriptions of essentially identical configurations as those described in FIGS. 3A and 3B may be omitted.

As previously described in some detail regarding the placement of the first metal line 310 and the second metal line 320, the first metal line 310 and the second metal line 320 may be arranged on the same layer or on different layers between the sealing member 300 and the display substrate 20.

In an example embodiment, referring to FIGS. 6A and 6B, the first metal line 310 may be arranged between the second gate insulation film 213b and the interlayer insulation film 215. In this case, the second metal line 320 may be arranged between the first gate insulation film 213a and the second gate insulation film 213b. However, example embodiments of the present invention are not limited thereto, and the first metal line 310 and the second metal line 320 may be arranged on any different layers provided between the sealing member 300 and the display substrate 20.

Even in the case that the first metal line 310 and the second metal line 320 are arranged on different layers, the first metal line 310 and the second metal line 320 may be electrically connected. In an example embodiment, as shown in FIG. 6A, the contact hole H may be formed on a portion of the second gate insulation film 213b. The first metal line 310 and the second metal line 320 may be electrically connected, as the first metal line 310 contacts the second metal line 320 by using the contact hole H.

As previously described in some detail, the display apparatus 1 according to example embodiments of the present invention may improve the delamination which may be caused by the ESD and cutting defects of the substrate simultaneously, by including the first metal line 310 provided below the sealing member 300 and the second metal line 320, which is arranged to be spaced apart from the first metal line 310.

Although the display apparatus 1 and the sealing portion SA according to one or more example embodiments have been described with reference to the figures, the aforementioned embodiments are merely examples. It will be understood by those of ordinary skill in the art that various changes in form and details may be made therein without departing from the spirit and scope as defined by the following claims, and their equivalents.

What is claimed is:

1. A display apparatus comprising:
   a display substrate;
   a display on the display substrate, the display comprising a display device;
   a sealing substrate on the display substrate;
   a sealing member bonding the display substrate and the sealing substrate, the sealing member surrounding the display;
   a first metal line entirely beneath the sealing member and surrounding the display;
   a second metal line on the display substrate and spaced apart from the first metal line, the second metal line being arranged outside an outer edge of, and spaced apart from, the sealing member in a direction away from a display area in a plan view, a width of the first metal line being greater than a width of the second metal line;

one or more connectors connecting the first metal line and the second metal line with each other; and one or more insulating layers, wherein a portion of one of the insulating layers is arranged above the first metal line and the second metal line.

2. The display apparatus of claim 1, wherein the second metal line comprises a first portion extending in a lengthwise direction of the display and a second portion extending in a widthwise direction of the display.

3. The display apparatus of claim 2, further comprising two or more connectors connecting the first metal line to the second metal line, wherein the two or more connectors are provided at both ends of each of the first portion and the second portion of the second metal line.

4. The display apparatus of claim 3, wherein the two or more connectors are spaced apart from one another by a first distance along the lengthwise direction of the display between the first portion of the second metal line and the first metal line, and spaced apart from one another by a second distance along the widthwise direction of the display between the second portion of the second metal line and the first metal line.

5. The display apparatus of claim 4, wherein first distance is equal to the second distance.

6. The display apparatus of claim 4, wherein first distance is different from the second distance.

7. The display apparatus of claim 1, wherein the display comprises a thin film transistor comprising a gate electrode, a source electrode, and a drain electrode, and a capacitor comprising a plurality of capacitor electrodes; and the first metal line and the second metal line are on a same layer as any one of the gate electrode, the source electrode, the drain electrode, and the plurality of capacitor electrodes.

8. The display apparatus of claim 7, wherein the first metal line and the second metal line comprise a same material as a material in any one of the gate electrode, the source electrode, the drain electrode, and the plurality of capacitor electrodes.

9. The display apparatus of claim 1, wherein the first metal line is arranged between two of the one or more insulating layers.

10. The display apparatus of claim 9, wherein the first metal line and the second metal line are at a same layer.

11. The display apparatus of claim 1, wherein the first metal line is spaced from the second metal line by 30 µm or more.

12. The display apparatus of claim 1, wherein the sealing member comprises glass frit.

13. The display apparatus of claim 1, wherein the display device is an organic light-emitting device comprising a first electrode, an intermediate layer comprising an organic light-emitting layer, and a second electrode consecutively stacked on one another, respectively.

14. The display apparatus of claim 1, wherein the one or more connectors comprise at least a portion that is spaced apart from the sealing member in the direction away from the display area in the plan view.

15. A display apparatus comprising:

a display substrate;

a display on the display substrate, the display comprising a display device;

a sealing substrate on the display substrate;

a sealing member bonding the display substrate and the sealing substrate, the sealing member surrounding the display;

a first part of a metal line entirely beneath the sealing member and surrounding the display, a width of the first part of the metal line being the same as a width of the sealing member;

a second part of the metal line on the display substrate and spaced apart from the first part of the metal line, the second part of the metal line being arranged outside an outer edge of, and spaced apart from, the sealing member in a direction away from a display area in a plan view;

one or more connecting parts connecting the first part of the metal line and the second part of the metal line with each other, and comprising at least a portion that is spaced apart from the sealing member in the direction away from the display area in the plan view; and one or more insulating layers, wherein a portion of one of the insulating layers is arranged above the first part of the metal line and the second part of the metal line.

* * * * *